US008528627B2

(12) United States Patent
Hsu et al.

(10) Patent No.: US 8,528,627 B2
(45) Date of Patent: Sep. 10, 2013

(54) HEAT-DISSIPATING DEVICE HAVING AIR-GUIDING COVER

(75) Inventors: Ken Hsu, Wugu Township, Taipei County (TW); Chih-Hung Cheng, Wugu Township, Taipei County (TW); Kuo-Len Lin, Wugu Township, Taipei County (TW)

(73) Assignees: Golden Sun News Techniques Co., Ltd., New Taipei (TW); Cpumate Inc., New Taipei (TW)

( * ) Notice: Subject to any disclaimer, the term of this patent is extended or adjusted under 35 U.S.C. 154(b) by 1201 days.

(21) Appl. No.: 11/954,734

(22) Filed: Dec. 12, 2007

(65) Prior Publication Data
US 2009/0154097 A1 Jun. 18, 2009

(51) Int. Cl.
*H01L 23/467* (2006.01)

(52) U.S. Cl.
USPC ............... 165/80.3; 165/104.33; 165/80.4; 361/695; 361/697

(58) Field of Classification Search
USPC .............. 361/697, 695; 165/76, 80.2, 80.3, 165/96, 104.21, 104.33, 104.34
See application file for complete search history.

(56) References Cited

U.S. PATENT DOCUMENTS

| 3,195,626 | A | * | 7/1965 | Druseikis et al. | ............. | 165/179 |
| 5,502,619 | A | * | 3/1996 | Wang | ............. | 361/697 |
| 5,583,746 | A | * | 12/1996 | Wang | ............. | 361/697 |
| 6,360,816 | B1 | * | 3/2002 | Wagner | ............. | 165/122 |
| 6,481,963 | B1 | * | 11/2002 | Lin et al. | ............. | 415/220 |
| 6,892,800 | B2 | * | 5/2005 | Mok | ............. | 165/104.33 |
| 7,011,144 | B2 | * | 3/2006 | Zeighami et al. | ............. | 165/104.21 |
| 7,128,135 | B2 | * | 10/2006 | Mok et al. | ............. | 165/104.26 |
| 7,163,050 | B2 | * | 1/2007 | Wang et al. | ............. | 165/104.33 |
| 7,532,472 | B2 | * | 5/2009 | Lin et al. | ............. | 361/697 |
| 2002/0121358 | A1 | * | 9/2002 | Lee | ............. | 165/80.3 |
| 2002/0139518 | A1 | * | 10/2002 | Lee et al. | ............. | 165/121 |
| 2003/0079861 | A1 | * | 5/2003 | Lee | ............. | 165/80.3 |
| 2003/0137047 | A1 | * | 7/2003 | Lopatinsky et al. | ............. | 257/722 |
| 2005/0224214 | A1 | * | 10/2005 | Zeighami et al. | ............. | 165/104.21 |
| 2006/0045736 | A1 | * | 3/2006 | Lee et al. | ............. | 415/220 |

FOREIGN PATENT DOCUMENTS

TW 556962 10/2003

* cited by examiner

*Primary Examiner* — Brandon M Rosati
*Assistant Examiner* — Melanie Phero
(74) *Attorney, Agent, or Firm* — Chun-Ming Shih; HDLS IPR Services

(57) ABSTRACT

A wind guider of integrated circuit heat dissipation structure includes a first connecting portion, wide-guiding pipes, a second connecting portion and wind-guiding holes. The first connecting portion is connected to heat-dissipating fins. The wide-guiding pipes are integrally connected to the first connecting portion. The second connecting portion is integrally connected to the wide-guiding pipes. A heat-dissipating fan is mounted in the second connecting portion. The second connecting portion is not in parallel to the first connecting portion. The wide-guiding holes run through the first connecting portion, the wide-guiding pipes and the second connecting portion. Since the second connecting portion is not in parallel to the first connecting portion, a cooling airflow generated by the heat-dissipating fan in the second connecting portion can blow to a region corresponding to the heat-dissipating fins. Thus, the cooling airflow blows to the hottest portion of the heat-dissipating fins directly, thereby improving the cooling efficiency and lowering the temperature of the integrated circuit.

11 Claims, 9 Drawing Sheets

HEAT-DISSIPATING DEVICE HAVING AIR-GUIDING COVER

BACKGROUND OF THE INVENTION

1. Field of the Invention

The present invention relates to a heat-dissipating device, and in particular to a heat-dissipating device having an air-guiding cover.

2. Description of Prior Art

Recently, since the operation speed of electronic elements in an electronic device becomes much faster, the power consumed by the electronic device also becomes larger, which increases the heat generated to a large extent. If the heat is not removed immediately, the electronic elements may not be operated normally. In order to make the electronic elements to be operated in normal temperature, it is necessary to provide a heat-dissipating device to dissipate the heat.

A traditional heat-dissipating device dissipates the heat generated by a heat-generating electronic element by means of adhering a heat-dissipating body on a surface of the heat-generating electronic element via heat-conducting paste. However, such a heat-dissipating action through the use of heat conduction has been unable to deal with the current electronic element that generates a large amount of heat, another conventional heat-dissipating device is thus developed, such as that disclosed in Taiwan Patent Publication No. TW00556962. This conventional heat-dissipating device is characterized in that: with an air-guiding means 20a provided between the heat-dissipating body and a fan, the air blown by the fan 50b can be guided into the heat-dissipating body 10c to take away the heat of the heat-dissipating body 10c compulsively. This heat-dissipating action utilizes heat convection to dissipate the heat. However, since the fan 50b is an axial fan, the air blown by the fan is a whirlwind that may collide with the heat-dissipating body 10c directly to diminish the convection effect. Unfortunately, turbulence is generated in the interior of the heat-dissipating body 10c to hinder the air from flowing out of the heat-dissipating body, which results in a bad heat-dissipating effect. Therefore, in view of the above drawbacks of prior art, the inventor of the present invention has proposed a novel and inventive structure based on his expert experience and researches.

SUMMARY OF THE INVENTION

The present invention is to provide a heat-dissipating device having an air-guiding cover. Via an air-guiding blade of the air-guiding cover, the air blown by a fan can be guided in or out of a heat-dissipating body rapidly. As a result, the air can be enhanced to a larger extent, so that the air can take away the heat on the heat-dissipating pieces rapidly to improve the heat-dissipating effect.

The present invention is to provide a heat-dissipating device having an air-guiding cover. With the heat-dissipating device being arranged above a heat-generating electronic element of a main board, the air-guiding blade of the air-guiding cover guides the air blown by the fan downwardly out of the heat-dissipating body, so that the air can blow to the main board directly to take away the heat generated by the heat-generating element and each neighboring electronic element, thereby enhancing the heat-dissipating effect.

The present invention is to provide a heat-dissipating device having an air-guiding cover, which includes a heat-dissipating body, an air-guiding cover, a plurality of heat pipes, a fixing base and a fan. The heat-dissipating body is constituted of a plurality of heat-dissipating pieces that are stacked up at intervals. On the heat-dissipating body, venting channels penetrating through each heat-dissipating piece and a plurality of through holes are provided. The air-guiding cover comprises a hollow cylinder and an air-guiding blade extending inwardly from an inner wall of the hollow cylinder. The hollow cylinder covers the heat-dissipating body. The air-guiding blade is accommodated in the venting channel. Each of the plurality of heat pipes comprises a section to be heated and a heat-releasing section extending from the section to be heated. The heat-releasing section penetrates into the through hole. The bottom of the fixing base is provided with a plurality of grooves for accommodating the sections to be heated of the heat pipes. The fan is provided above the air-guiding cover.

DETAILED DESCRIPTION OF THE INVENTION

The detailed description and the technical contents of the present invention will be explained with reference to the accompanying drawings. However, the drawings are illustrative only and are not used to limit the scope of the present invention.

Figure 1:
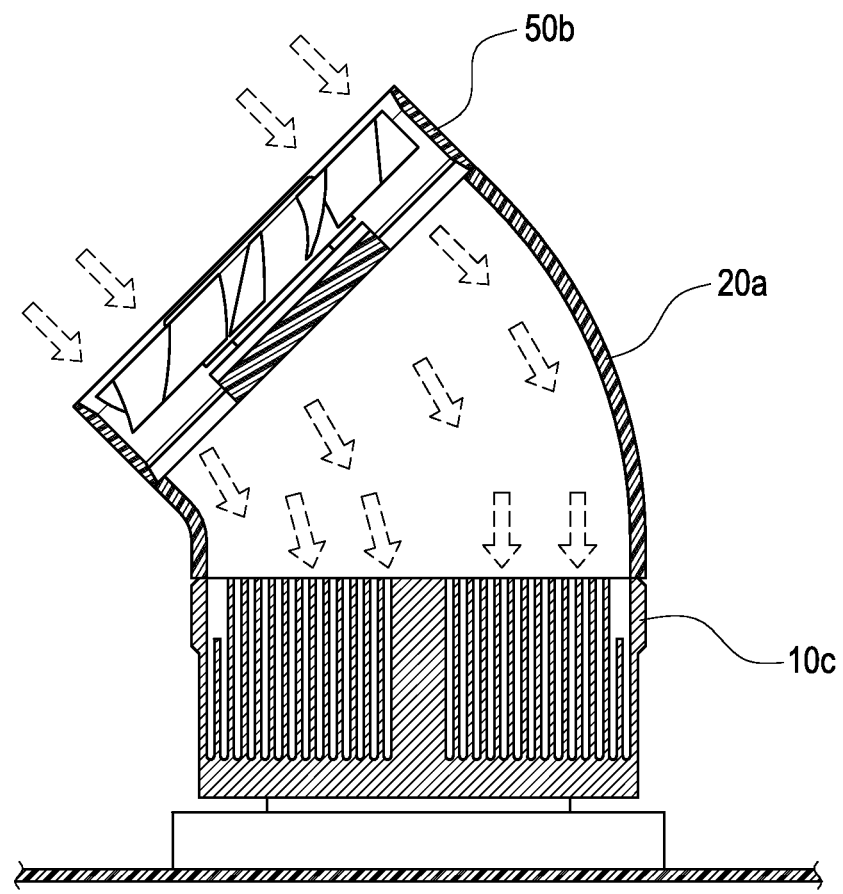
FIG. 1 is a side view showing a structure of prior art.
Figure 2:
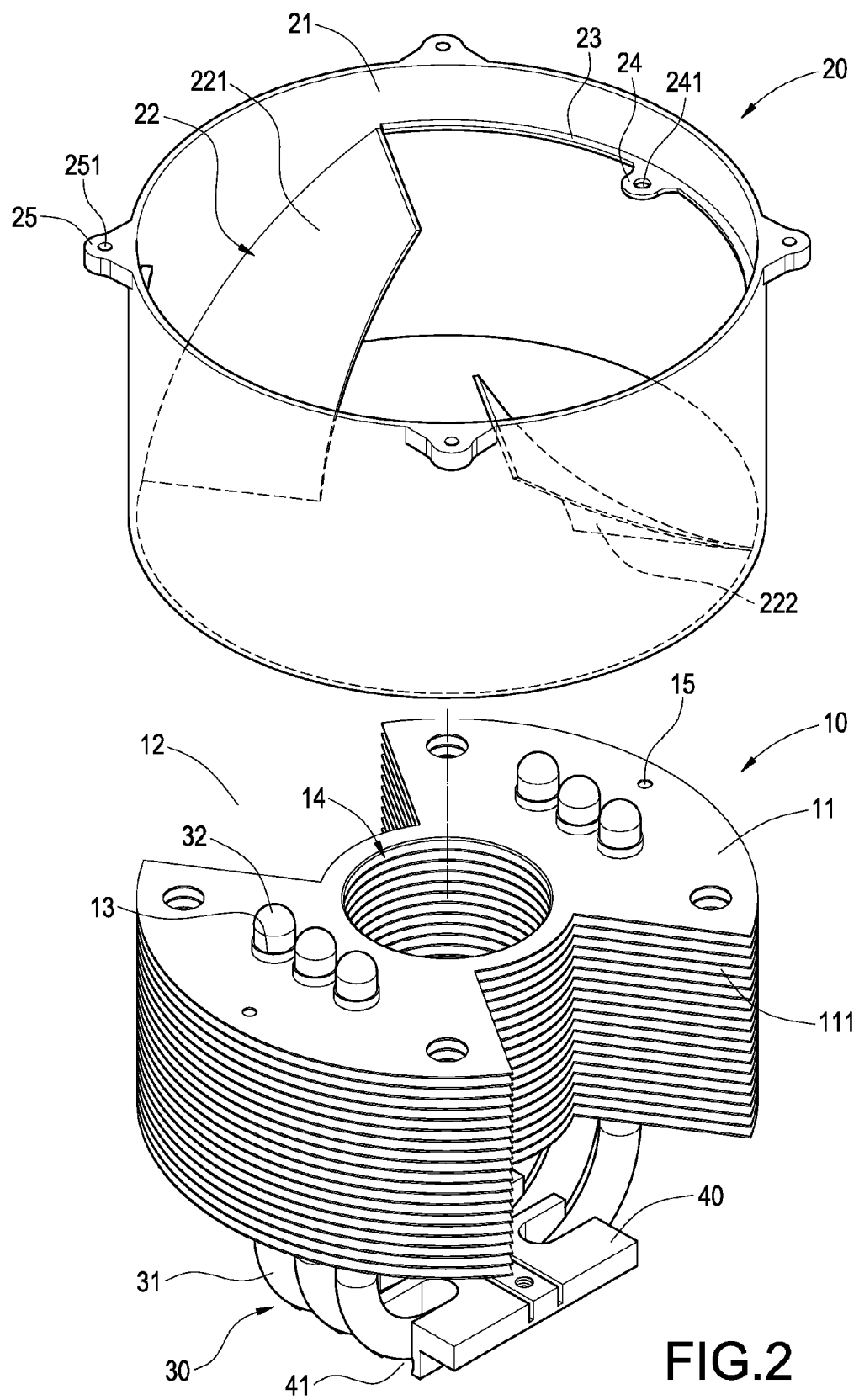
FIG. 2 is an exploded perspective view showing the structure of the present invention.
Figure 3:
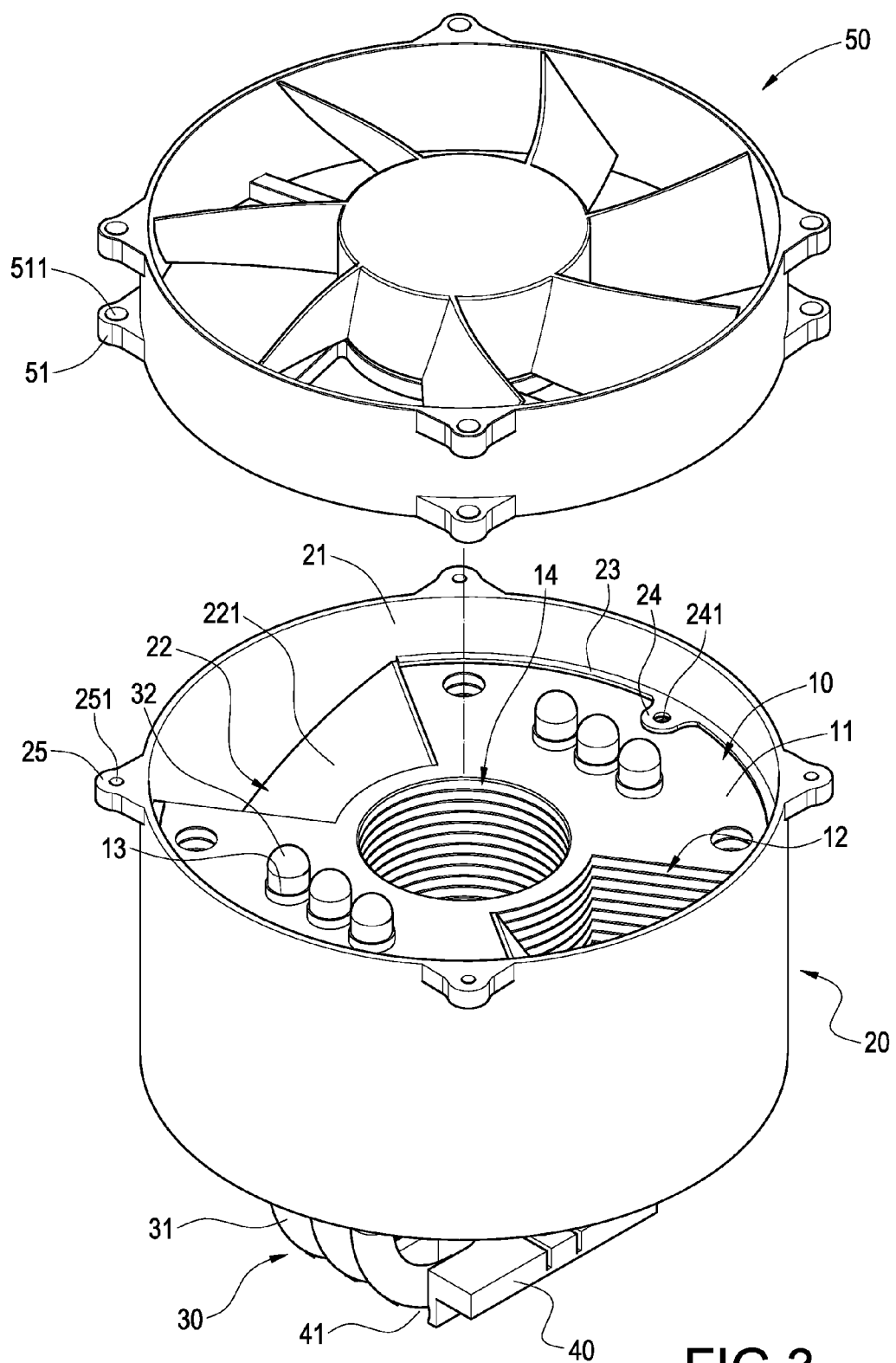
FIG. 3 is an exploded perspective view showing the structure in FIG. 2 and a fan.
Figure 4:
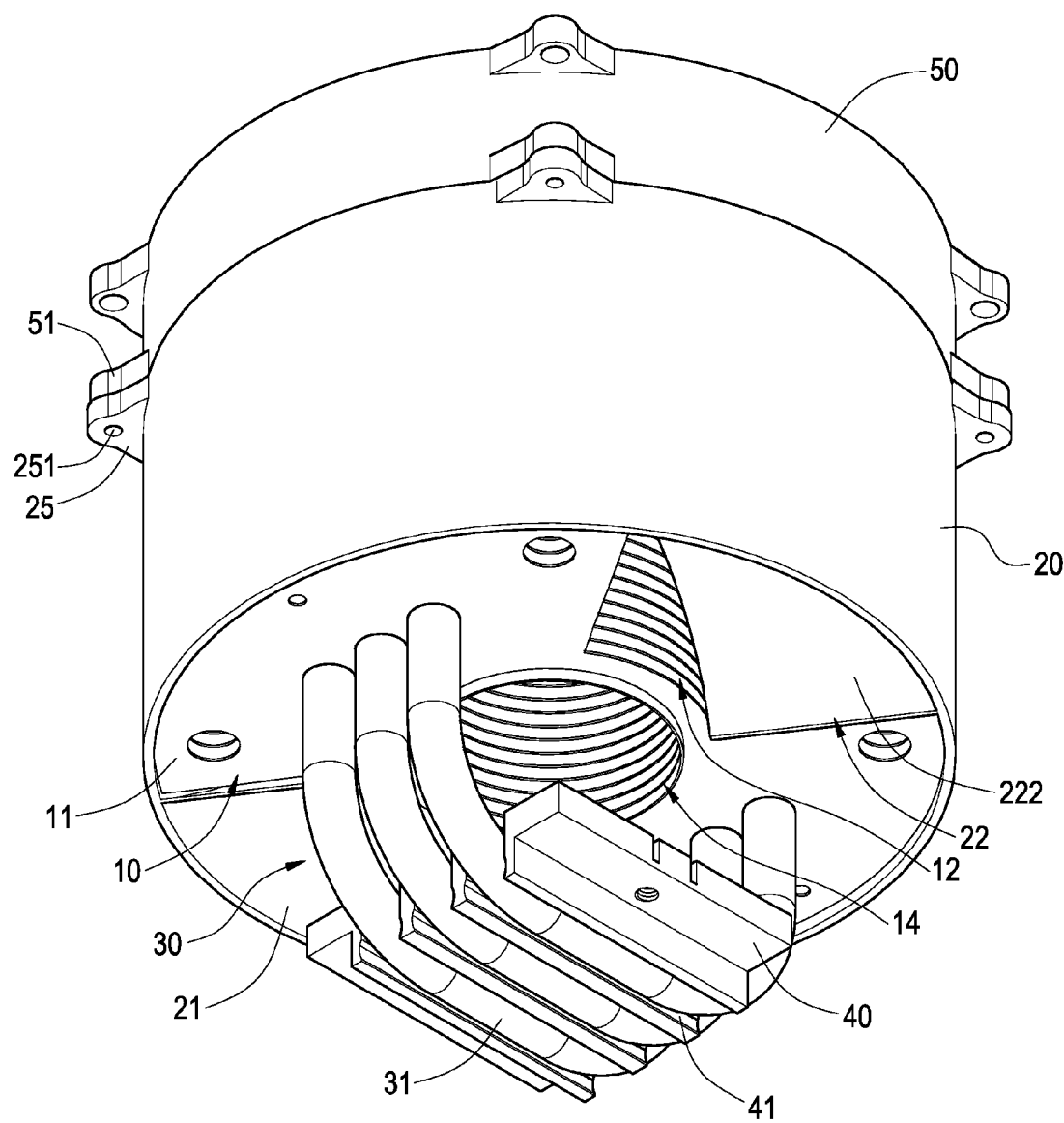
FIG. 4 is a bottom perspective view of the present invention.

FIG. 2 is an exploded perspective view showing the structure of the present invention. FIG. 3 is an exploded perspective view showing the structure in FIG. 2 and a fan. FIG. 4 is a bottom perspective view of the present invention. The present invention provides a heat-dissipating device having an air-guiding cover, which can be arranged on a heat-generating electronic element of a main board (not shown) and includes a heat-dissipating body 10, an air-guiding cover 20, a plurality of heat pipes 30, a fixing base 40 and a fan 50. The heat-dissipating body 10 is constituted of a plurality of heat-dissipating pieces 11 that are stacked up at intervals. On the heat-dissipating body 10, venting channels 12 penetrating through each heat-dissipating piece 11, a plurality of through holes 13 and fixing holes 15 are provided. The shape of the heat-dissipating body 10 corresponds to that of the fan 50 and can be a cylindrical body. Further, the central portion of the heat-dissipating body 10 is provided with a central penetrating hole 14 by which the air blown by the fan 50 can pass through the heat-dissipating body 10 directly.

The air-guiding cover 20 comprises a hollow cylinder 21 and an air-guiding blade 22 extending inwardly from an inner wall of the hollow cylinder 21. The air-guiding blade 22 guides the air that blows downwardly from the top of the air-guiding cover 20. On the inner wall of the hollow cylinder 21, the top of the air-guiding blade 22 extend inwardly to form a locking frame 23. The hollow cylinder 21 covers the heat-dissipating body 10. The locking frame 23 is secured to the top surface of the heat-dissipating body 10. The air-guiding blade 22 is accommodated in the venting channel 12. The air-guiding blade 22 is inclined, so that the flowing direction of the air blown by the fan 50 will be changed when colliding with the surface of the air-guiding blade 22. Further, a lug 24 extends from the locking frame 23. The lug 24 is provided thereon with an inner penetrating hole 241. The inner penetrating hole 241 corresponds to the fixing hole 15 to allow a screwing element (not shown) to be penetrated and connected thereto, so that the air-guiding cover 20 and the heat-dissipating body 10 can be connected and fixed to each other. A fixing lug 25 extends outwardly from an outer wall of the top of the hollow cylinder 21. The fixing lug 25 is provided thereon with an outer penetrating hole 251.

Each of the plurality of heat pipes 30 comprises a section 31 to be heated and a heat-releasing section 32 extending from the section 31 to be heated. The heat-releasing section 32 penetrates into the through hole 13. The heat pipes 30 are U-shape pipes. The section 31 to be heated is located on the transverse section of the U-shape pipe, and the heat-releasing section 32 is located on the longitudinal section thereof. The heat pipe 30 can absorb the heat generated by the heat-generating electronic element via the section 31 to be heated and release the absorbed heat to the heat-dissipating pieces 11 via the heat-releasing section 32.

The bottom of the fixing base 40 is provided with a plurality of grooves 41 for accommodating the sections 31 to be heated of the heat pipes 30. The fan 50 is provided above the air-guiding cover 20. The fan 50 is an axial fan. A fan fixing lug 51 extends from an outer wall of the fan 50. The fan fixing lug 51 is provided thereon with a fan penetrating hole 511. The fan penetrating hole 511 corresponds to the outer penetrating hole 251 for allowing a screwing element (not shown) to be penetrated and connected thereto.

Figure 5:
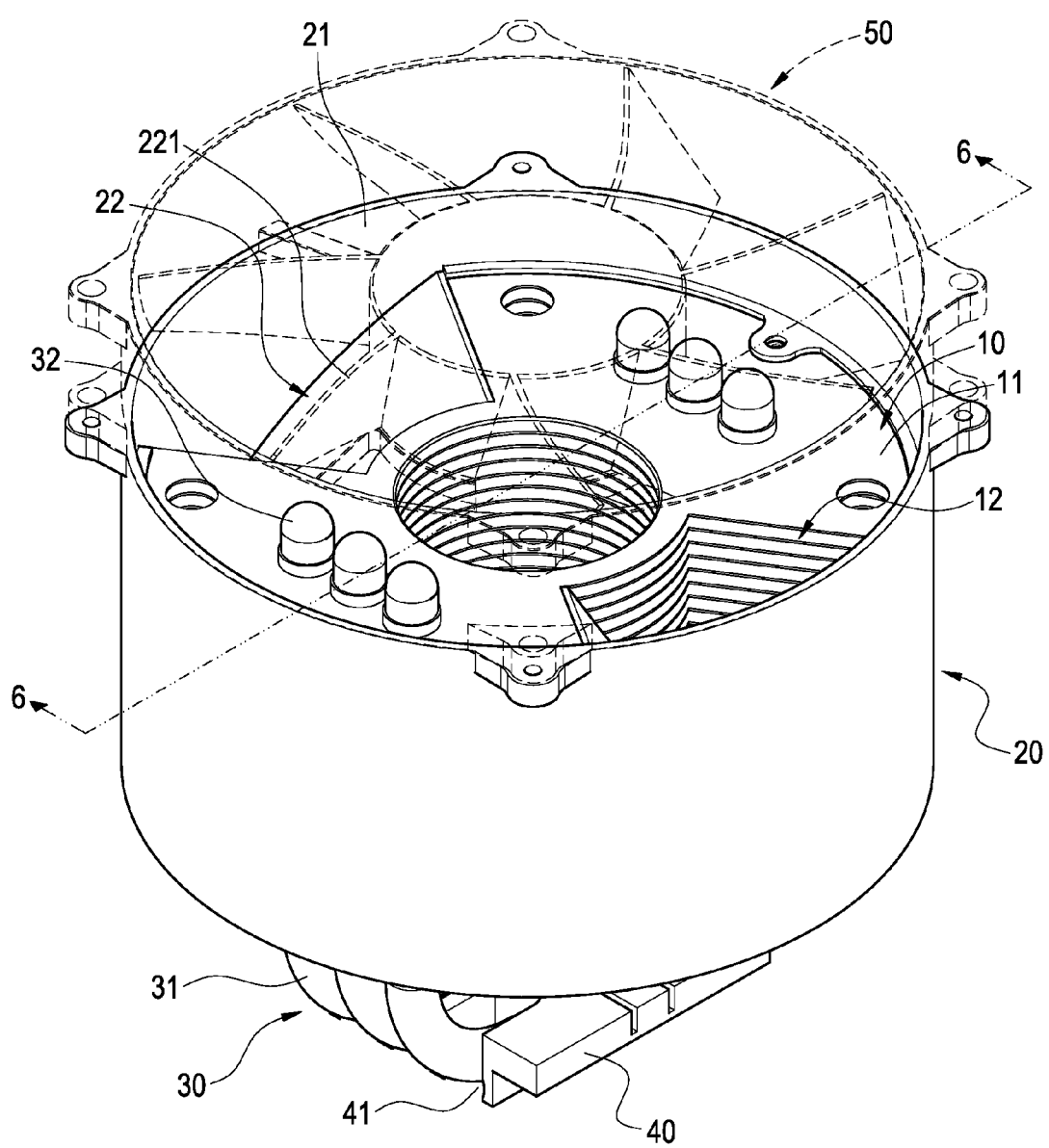
FIG. 5 is a perspective view of the present invention.
Figure 6:
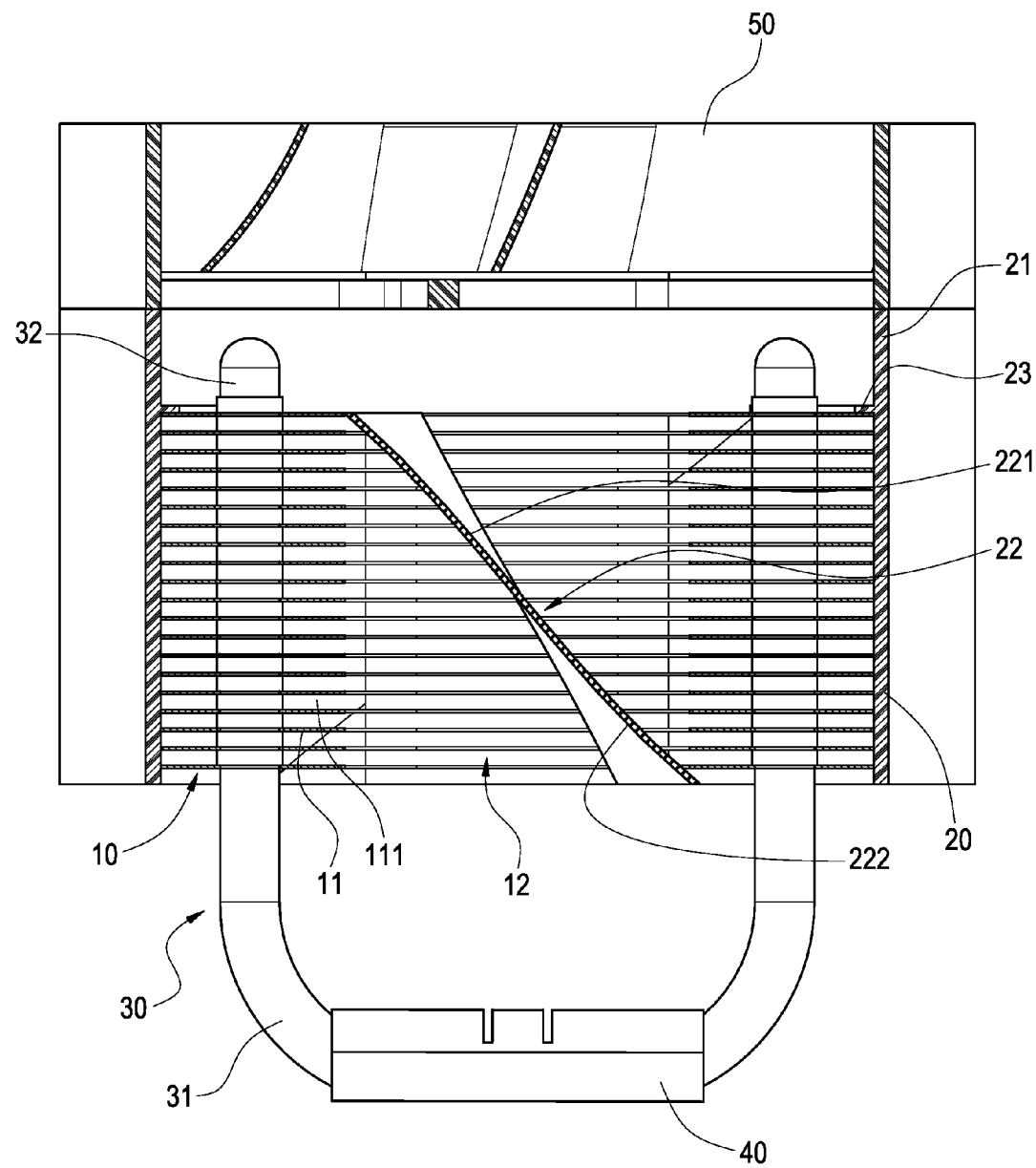
FIG. 6 is a cross-sectional view along the line 6-6 in FIG. 5.
Figure 7:
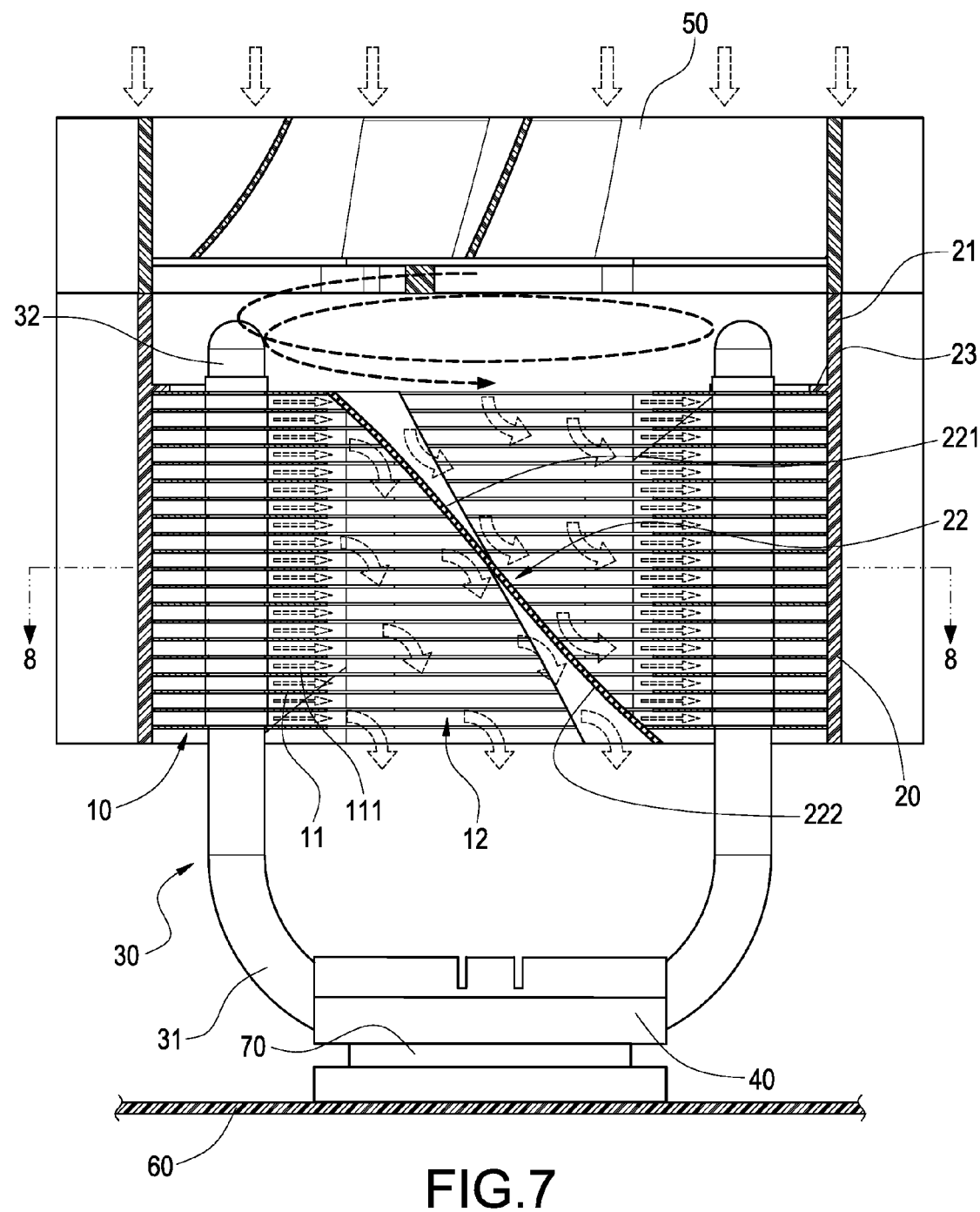
FIG. 7 is a schematic view showing an operating state of the present invention.
Figure 8:
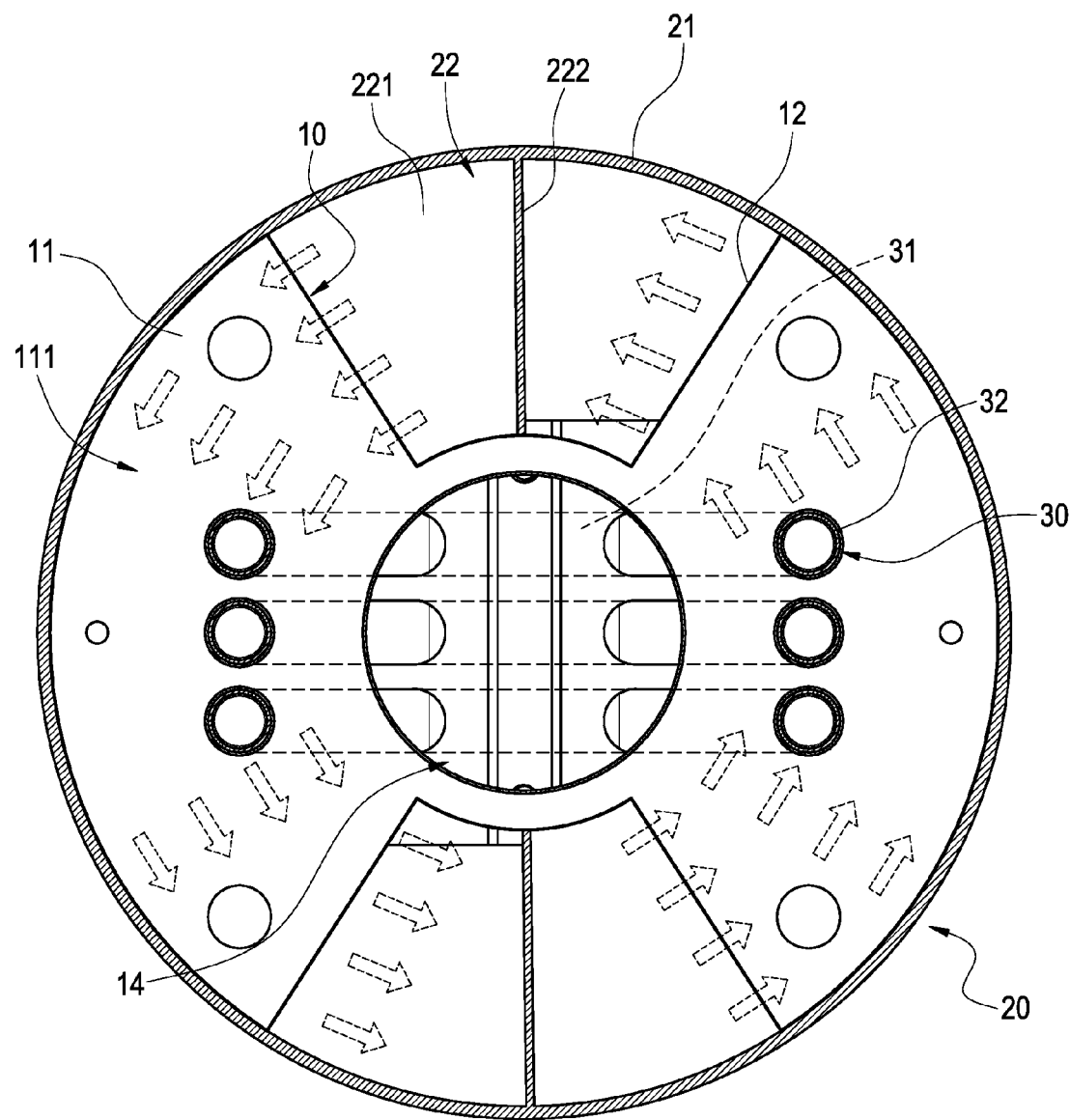
FIG. 8 is a cross-sectional view along the line 8-8 in FIG. 7.

FIG. 5 is a perspective view of the present invention. FIG. 6 is a cross-sectional view along the line 6-6 in FIG. 5. FIG. 7 is a schematic view showing an operating state of the present invention. FIG. 8 is a cross-sectional view along the line 8-8 in FIG. 7. The top of the air-guiding blade 22 is in flush with the top of the heat-dissipating body 10. When the heat-dissipating device is in use, the fan 50 operates first to draw in the air above the fan 50, and then generates a whirlwind to blow downwardly. When the generated airflow collides with a front air-guiding surface 221, it will be guided into the heat-dissipating body 10. The heat-dissipating body 10 is constituted of a plurality of heat-dissipating pieces 11 that are stacked up at intervals, so that there is a plurality of heat-dissipating paths 111 among the heat-dissipating pieces 11. The airflow will be guided in the heat-dissipating paths 111 to take away the heat on the heat-dissipating pieces 11. When the airflow exits the heat-dissipating paths 111 of the heat-dissipating body 10, it will collide with a back air-guiding surface 222. At the same time, the airflow will be guided to flow downwardly to take away the heat in the heat-dissipating body 10. Further, since the heat-dissipating device is arranged on a heat-generating electronic element 70 of a main board 60, when the airflow flows downwardly and exits the heat-dissipating body 10, it collides with the main board 60 to take away the heat generated by the heat-generating electronic element 70 and neighboring electronic elements (not shown), thereby enhancing the heat-dissipating effect.

Figure 9:
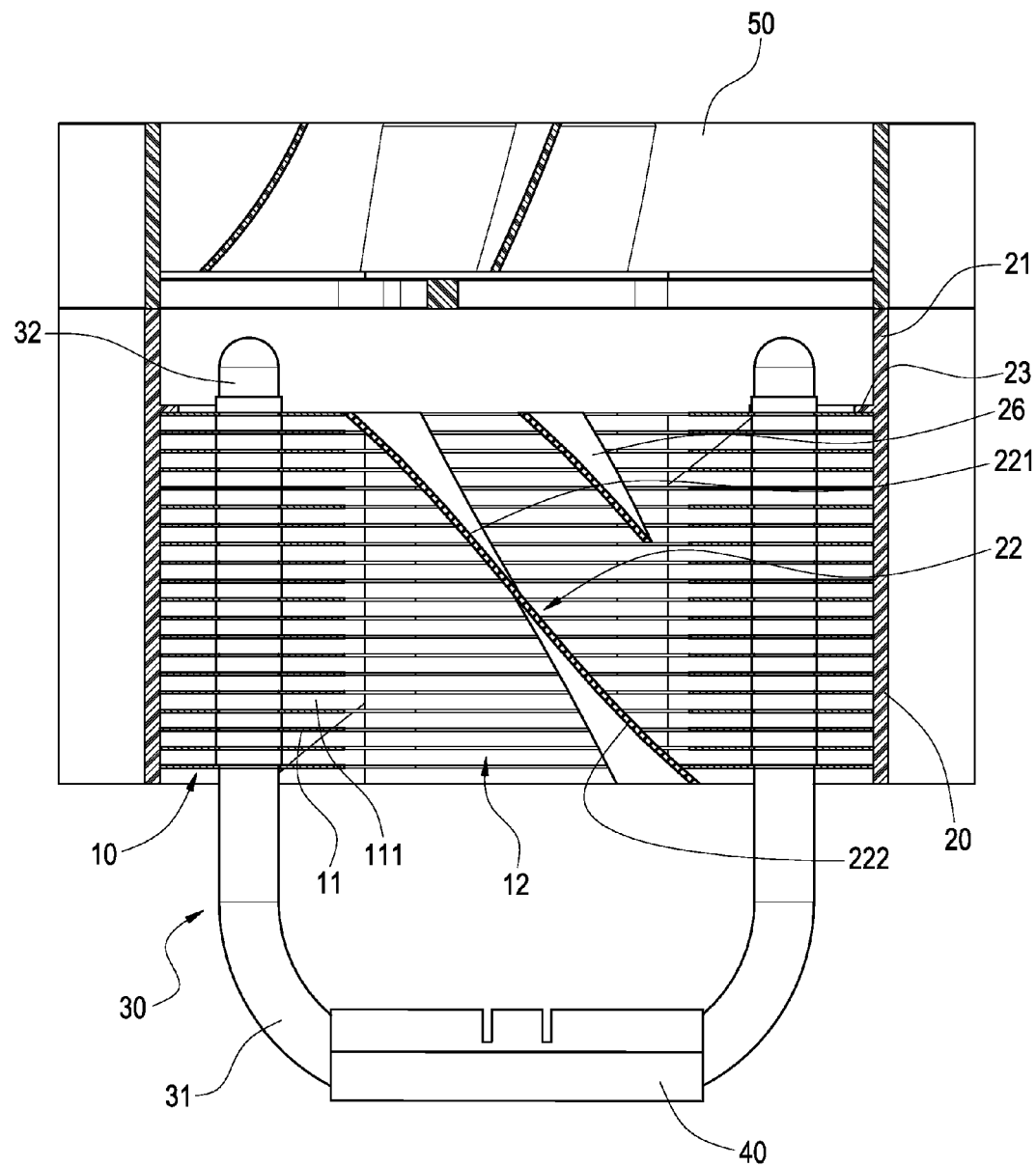
FIG. 9 is a side view showing another embodiment of the present invention.

With reference to FIG. 9, it is a side view showing another embodiment of the present invention. The heat-dissipating device can further comprise a secondary air-guiding blade 26 extending inwardly from the inner wall of the hollow cylinder 21. A plurality of airflow paths is formed between the air-guiding blade 22 and the secondary air-guiding blade 26, thereby improving the air-guiding effect of the air-guiding cover 20.

According to the above, the heat-dissipating device having an air-guiding cover of the present invention really has industrial applicability, novelty and inventive steps. Further, the present invention has not been seen in the articles of the same kind or used in public, and thus conforms to the requirements for a utility model patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An air-guiding cover mounted outside of a cylindrical heat-dissipating body with a venting channel, a portion of the center of the heat-dissipating body being hollow through the entire length thereof, the air-guiding cover comprising:
    a hollow cylinder surrounding the heat-dissipating body; and
    an air-guiding plate extending inwardly from an inner wall of the cylinder and accommodated in the venting channel to divide the venting channel into a first and a second air flow channels, the air-guiding plate being separate from a fan frame,
    wherein the air-guiding plate is helically inclined to the inner wall of the cylinder such that air entering the hollow cylinder is guided into the first air flow channel by a first surface of the air-guiding plate in a direction essentially along the length of the hollow cylinder and is diverged to run essentially perpendicular to the length of the hollow cylinder into heat-dissipating paths of the heat-dissipating body, and after the air flows out of the heat-dissipating paths, the air runs into the second air flow channel to be guided by a second surface of the air guiding plate that is opposite to the first surface to exit the hollow cylinder back to the direction essentially along the length of the hollow cylinder.

2. The air-guiding cover according to claim 1, wherein a locking frame extends inwardly from the inner wall of the cylinder and a top of the air-guiding plate, and wherein the locking frame is fixedly connected to the top surface of the heat-dissipating body.

3. The air-guiding cover according to claim 2, wherein a lug extends from the locking frame, the lug is provided thereon with an inner penetrating hole, and the inner penetrating hole corresponds to the heat-dissipating body to allow a screwing element to be penetrated and connected thereto.

4. The air-guiding cover according to claim 1, wherein the top of the air-guiding plate is in flush with the top of the heat-dissipating body.

5. The air-guiding cover according to claim 1, further comprising a secondary air-guiding plate extending inwardly from the inner wall of the cylinder, and a plurality of air-guiding paths is formed between the air-guiding plate and the secondary air-guiding plate.

6. A heat-dissipating device having an air-guiding cover, comprising:
    a heat-dissipating body being a cylinder body, a portion of the center of the heat-dissipating body being hollow through the entire length thereof, the heat-dissipating body having a plurality of heat-dissipating pieces that are stacked up at intervals to form heat-dissipating paths, a venting channel penetrating the heat-dissipating pieces and a plurality of through holes being provided on the heat-dissipating body;

an air-guiding cover, comprising:
- a hollow cylinder surrounding the heat-dissipating body; and
- an air-guiding plate extending inwardly from an inner wall of the cylinder and accommodated in the venting channel to divide the venting channel into a first and a second air flow channels, the air-guiding plate being separate from a fan frame,
- wherein the air-guiding plate is helically inclined to the inner wall of the cylinder such that air entering the hollow cylinder is guided into the first air flow channel by a first surface of the air-guiding plate in a direction essentially along the length of the hollow cylinder and is diverged to run essentially perpendicular to the length of the hollow cylinder into the heat-dissipating paths of the heat-dissipating body, and after the air flows out of the heat-dissipating paths, the air runs into the second air flow channel to be guided by a second surface of the air guiding plate that is opposite to the first surface to exit the cylinder back to the direction essentially along the length of the hollow cylinder;

a plurality of heat pipes each having a section to be heated and a heat-releasing section extending from the section to be heated, the heat-releasing section penetrating into the plurality of through holes;

a fixing base, a bottom thereof being provided with a plurality of grooves for accommodating the sections to be heated of the heat pipes; and a fan provided above the air-guiding cover for blowing air to each heat-dissipating piece.

7. The heat-dissipating device having an air-guiding cover according to claim 6, wherein a locking frame extends inwardly from the inner wall of the cylinder and a top of the air-guiding plate, and wherein the locking frame is fixedly connected to the top surface of the heat-dissipating body.

8. The heat-dissipating device having an air-guiding cover according to claim 7, wherein the heat-dissipating body is provided with a fixing hole for penetrating through each of the heat-dissipating pieces, a lug extends from the locking frame, the lug is provided thereon with an inner penetrating hole, and the inner penetrating hole corresponds to the fixing hole to allow a screwing element to be penetrated and connected thereto.

9. The heat-dissipating device having an air-guiding cover according to claim 6, wherein a fixing lug extends outwardly from an outer wall of the top of the cylinder, the fixing lug is provided thereon with an outer penetrating hole, a fan fixing lug extends from an outer wall of the fan, the fan fixing lug is provided thereon with a fan penetrating hole, and the fan penetrating hole corresponds to the outer penetrating hole to allow a screwing element to be penetrated and connected thereto.

10. The heat-dissipating device having an air-guiding cover according to claim 6, wherein the top of the air-guiding plate is in flush with the top of the heat-issipating body.

11. The heat-dissipating device having an air-guiding cover according to claim 6, further comprising a secondary air-guiding plate extending inwardly from the inner wall of the cylinder, and a plurality of air-guiding paths being formed between the air-guiding plate and the secondary air-guiding plate.

* * * * *